United States Patent [19]

Noomen et al.

[11] 4,164,459

[45] Aug. 14, 1979

[54] U.V.-CURABLE COATING COMPOSITION

[75] Inventors: Arie Noomen, Voorhout; Egbert Wolters, Amsterdam, both of Netherlands

[73] Assignee: Akzo N.V., Arnhem, Netherlands

[21] Appl. No.: 950,444

[22] Filed: Oct. 11, 1978

[30] Foreign Application Priority Data

Oct. 11, 1977 [NL] Netherlands .......................... 7711121

[51] Int. Cl.$^2$ ............................. C08F 8/18; C08F 8/34
[52] U.S. Cl. ........................ 204/159.18; 204/159.14; 204/159.15; 204/159.16; 204/159.19; 204/159.23; 96/115 P; 427/54; 428/418; 428/425; 428/463
[58] Field of Search ...................... 204/159.15, 159.18, 204/159.19, 159.23, 159.16; 96/115 P

[56] References Cited

U.S. PATENT DOCUMENTS

| | | | |
|---|---|---|---|
| 3,536,489 | 10/1970 | Smith | 96/28 |
| 3,597,343 | 8/1971 | Delzenne et al. | 204/159.23 |
| 3,617,279 | 11/1971 | London et al. | 96/35.1 |
| 3,959,100 | 5/1976 | McGinniss | 204/159.15 |
| 4,009,040 | 2/1977 | Nebe | 96/115 R |
| 4,040,922 | 8/1977 | Wang et al. | 204/159.15 |
| 4,125,678 | 11/1978 | Stvan et al. | 428/514 |

*Primary Examiner*—Richard B. Turer
*Attorney, Agent, or Firm*—Stevens, Davis, Miller & Mosher

[57] ABSTRACT

A coating composition is disclosed which is curable under the influence of ultraviolet light and which comprises a U.V.-curable binder, a photoinitiator and as accelerator a tetrahydro-1,3-oxazine compound and/or an oxazolidine compound. The U.V.-curable binder is preferably an adduct containing at least one isocyanate group of (a) an acrylic or methacrylic hydroxy ester having 5 to 20 carbon atoms and (b) a polyisocyanate having 4 to 40 carbon atoms and 2 to 4 isocyanate groups.

10 Claims, No Drawings

U.V.-CURABLE COATING COMPOSITION

This invention relates to a coating composition which can be cured under the influence of ultraviolet light and is based on a U.V-curable binder, a photoinitiator and a nitrogen-containing accelerator. In known compositions use is made generally of an aromatic carbonyl compound as photoinitiator, and of an alkanolamine as accelerator. Upon curing pigmented or non-pigmented compositions this combination leads to coatings having a good surface hardness. A drawback, however, is that the alkanolamines are generally insufficiently compatible with U.V-curable binders, so that hazing takes place in the coating of the cured composition or exudation of the accelerator as a result of migration of these accelerators. Another drawback consists in that when alkanolamines are used it is not possible to choose any U.V.-curable binder; no use can be made for instance of a binder with isocyanate groups, because the resulting reaction between such components would cause the composition to have an inadmissibly short residence time.

An object of the present invention is to provide a composition which does not show the above-mentioned drawbacks and retains the advantages of rapid and proper curing.

The composition according to the invention is characterized in that the accelerator is a tetrahydro-1,3-oxazine compound and/or an oxazolidine compound. For the sake of brevity these compounds are generally referred to hereinafter as tetrahydro-oxaza compounds.

As a binder generally any U.V-curable binder may be chosen. As examples of suitable binders may be mentioned unsaturated polyester resins and alkyd resins, unsaturated epoxy resins, unsaturated melamine-formaldehyde resins, urethan acrylate resins, polybutadiene resins and unsaturated compounds such as (meth)acrylates and allyl compounds. It is preferred that use should be made of a urethan acrylate resin, more particularly an adduct containing at least one isocyanate group of (a) an acrylic or methacrylic hydroxy ester having 5 to 20 carbon atoms and (b) a polyisocyanate having 4 to 40 carbon atoms and 2 to 4 isocyanate groups. Use of this urethan acrylate resin offers the advantage that the tetrahydro-oxaza compound(s) is (are) chemically bonded in the final coating layer, as a result of which undesirable plasticizing effect is avoided. The use of a polyfunctional tetrahydro-oxaza compound has the additional advantage that it results in an increase in the molecular weight of the isocyanate compound, so that the physical properties and the durability of the coating are further improved. It is, of course, also possible to use mixtures of unsaturated polymers in combination, if desired, with saturated polymers, or to employ U.V.-curable mixtures of polymers and saturated or unsaturated monomeric compounds.

As examples of illustrative U.V.-curable polyesters may be mentioned polycondensation products from unsaturated di- or polycarboxylic acids or derivatives thereof, for instance: maleic acid, maleic anhydride, fumaric acid, and polyols such as ethylene glycol, 1,2-propane diol, diethylene glycol, 1,3-propylene glycol, polyethylene glycol, hexane diol, glycerol, trimethylol propane and/or pentaerythritol. Besides the unsaturated carboxylic acids there may be present saturated carboxylic acids, for instance: synthetic and/or natural fatty acids, benzoic acid, isononanoic acid, malonic acid, glutaric acid, adipic acid, azelaic acid, sebacic acid, tetrahydrophthalic acid, phthalic acid, phthalic anhydride, isophthalic acid, terephthalic acid, hexachlorendomethylene tetrahydrophthalic acid and/or trimellitic acid. Usually these polyesters are mixed with unsaturated monomeric compounds having vinyl groups and/or allyl groups. As monomeric compounds as a rule styrene, vinyl toluene and/or methyl methacrylate are employed.

Illustrative unsaturated epoxy resins are for example the products of reacting compounds having one or more epoxy groups with (meth)acrylic acid. As examples of suitable epoxy compounds may be mentioned butylglycidyl ether, 2-ethylhexylglycidyl ether, 1,4-butane diol diglycidyl ether and the diglycidyl ethers of 4,4'-dihydroxydiphenyl-2,2-propane, 1,1'-isopropylidene-bis-(p-phenyleneoxy)-2-diethanol and 1,1'-isopropylidene-bis-(p-phenyleneoxy)-2-dipropanol.

Illustrative urethan acrylate resins are for example the reaction products of one or more di- or polyisocyanates and one or more hydroxy (meth)acrylates. As examples of suitable isocyanate compounds may be mentioned hexamethylene diisocyanate, 2,2,4-trimethylhexane-1,6-diisocyanate, 2,4,4-trimethylhexane-1,6-diisocyanate, cyclohexyl-1,4-diisocyanate, isophoron diisocyanate, the adduct of 1 molecule of 1,4-butane diol and 2 molecules of isophoron diisocyanate, the adduct of 1 molecule of 1,4-butane diol and 2 molecules of hexamethylene diisocyanate, dicyclohexyl methane-4,4'-diisocyanate, xylylene diisocyanate, 1,3,5-trimethyl-(2,4-ω-diisocyanatomethyl)-benzene, toluenediisocyanate, diphenylmethane-4,4'-diisocyanate, the adduct of 3 molecules of hexamethylene diisocyanate and 1 molecule of trimethylol propane and 3 molecules of isophoron diisocyanate, the adduct of 1 molecule of trimethylol propane and 3 molecules of toluene diisocyanate and the adduct of 1 molecule of pentaerythritol and 4 molecules of hexamethylene diisocyanate. As examples of suitable hydroxy(meth)acrylates containing at least one hydroxy group may be mentioned 2-hydroxyethyl acrylate, 2-hydroxyethyl methacrylate, 3-hydroxypropyl methacrylate, 4-hydroxybutyl acrylate, 12-hydroxydodecanyl acrylate, 2-hydroxy-3-chloropropyl acrylate, trimethylol propane diacrylate, trimethylol propane dimethacrylate, pentaerythritol diacrylate and pentaerythritol triacrylate.

Illustrative (meth)acrylates and allyl compounds are for example methyl acrylate, methyl methacrylate, ethyl acrylate, ethyl methacrylate, butyl acrylate; (meth)acrylic esters of aliphatic doils and/or polyols, for instance: ethylene diacrylate, trimethylol propane triacrylate and pentaerythritol tetraacrylate; hydroxy(meth)acrylates such as hydroxyethyl acrylate, 3-hydroxypropyl acrylate, 3-hydroxypropyl methacrylate, 4-hydroxybutyl acrylate and pentaerythritol triacrylate and allyl compounds such as diallyl phthalate, diallyl maleate, triallyl isocyanurate and ethylene glycol diallyl ether. Optionally, these compounds may be mixed with possibly smaller amounts of monomers such as acrylonitrile, methacrylonitrile, acrylamide, methacrylamide, N,N-disubstituted acrylamides and methacrylamides, vinyl acetate, succinic divinyl ester, isobutyl vinyl ether, 1,4-butane diol divinyl ether, styrene, alkyl styrene, halogen styrene, divinyl benzene, vinyl naphthalene and N-vinyl pyrrolidone.

Suitable photoinitiators are for example: aromatic carbonyl compounds such as benzil, benzil dimethyl ketal, acetophenone, substituted acetophenones, thioxanthone and chlorothioxanthone. It is preferred that use should be made of benzophenone. Optionally, use may be made of coloured compounds such as aromatic azo compounds and compounds such as benzoin and ethers thereof, such as the methyl ether, the ethyl ether, the propyl ether and the tert.butyl ether. Also mixtures of photoinitiators may be used. The photoinitiator is usually present in an amount of 0.05 to 10% by weight, based on the U.V-curable binder.

The tetrahydro-oxaza compounds to be used as accelerator in the photoinitiator system may be low-molecular; for example: 3-propyl-tetrahydro-1,3-oxazine, 4-propyl oxazolidine, 5-methyl oxazolidine, 2,2-dimethyl oxazolidine, 1-butyl-2,2-dimethyl oxazolidine, 1-methyl-2-butyl oxazolidine, 1-ethyl oxazolidine, 1-ethyl-2,2-dimethyl oxazolidine, 1-ethyl-2-isopropyl oxazolidine and 2-benzyl-3-propyl-tetrahydro-1,3-oxazine. It is preferred, however, that use should be made of an oxazolidine compound in which one or more oxazolidine groups are attached to an oligomer chain or polymer chain by the nitrogen atom. Examples of such higher molecular oxazolidine compounds are the polyester oxazolidines described in the Netherlands patent Applications Nos. 6,915,784 and 6,915,786, and the acryloyl oxazolidinyl compounds described in U.S. Pat. No. 3,037,006 and the hydroxyl groups—containing polymers having oxazolidine groups described in German Patent Application No. 24 38 320. For suitable tetrahydro-1,3-oxazine compounds reference is made to U.S. Pat. No. 3,037,006. The tetrahydro-1,3-oxazine compound and/or the oxazolidine compound is usually present in an amount of 0.1 to 100% by weight, based on the U.V.-curable binder.

The coating composition may, if desired, still contain other additives, for example: pigment dispersing agents, levelling agents, fillers, pigments, dyes, polymerization inhibitors and inert or non-inert solvents.

Applying the coating composition to the desired substrate may be effected in any convenient manner, for instance, by rolling, brushing, sprinkling, flow coating, dipping or spraying. The coating composition may be applied to any substrate, for instance to a plastics material, chip board, board, wood and preferably to metal substrates as coating in an automobile paint system.

As a U.V.-radiation source may for instance serve a mercury or xenon lamp operating at high, medium or low pressure. The composition need be exposed to radiation generally only for a few seconds up to a few minutes. The ultraviolet light employed usually has a wave length of 90–600 nm.

The invention is further described but not limited by the following examples. In them the hardness of the cured coating was measured in accordance with the Persoz method and is expressed in seconds. The gloss and the appearance were determined visually.

EXAMPLES I AND II

Mixtures of 100 parts by weight of a 60% by weight solution of the adduct of 1 mole of hexamethylene diisocyanate and 2 moles of pentaerythritol triacrylate in trimethylol propane triacrylate, 2 parts by weight of benzophenone and as accelerator respectively 3,5 parts by weight of 2-isopropyloxazolidine (I) and 6.2 parts by weight of dioxazolidinylethyl adipate (II) were applied to a degreased steel panel to a layer thickness of 30 μm (in the cured state).

For comparison the procedure used in Example I was repeated, except that use was made of 2.0 parts by weight of dimethylamino ethanol as accelerator.

Irradiation of the composition was carried out with the aid of a high-pressure mercury-vapour lamp (of the HOK type made by Philips), with the lamp being positioned at a distance of 18 cm from the substrate. In each experiment the substrate was passed under the lamp once at a speed of 10 m/minute. The results are mentioned in Table 1.

Table 1.

| Example | Hardness | Gloss | Appearance |
|---|---|---|---|
| I | 142 | excellent | excellent |
| II | 150 | excellent | excellent |
| Comparative Example A | 121 | moderate | exudation symptoms |

EXAMPLES III AND IV

The procedure used in Example I was repeated, except that use was made of a 70% by weight solution of the reaction product of 1 mole of diglycidyl ether of bisphenol A (available under the trade name Epikote 828 of Shell) and 2 moles of acrylic acid in polyethylene glycol diacrylate. The composition was subjected to radiation for 30 seconds with a medium-pressure mercury-vapour lamp (HTQ type made by Philips), with the lamp being positioned at a distance of 40 cm from the substrate. In Example III use was made of 2-isopropyl oxazolidine and in Example IV dioxazolidinylethyl adipate.

For comparison the procedure used in Example III was repeated, except that use was made of dimethylamino ethanol as accelerator in an amount of 2.0 parts by weight.

The results are mentioned in Table 2.

Table 2.

| Example | Hardness | Gloss | Appearance |
|---|---|---|---|
| III | 61 | excellent | excellent |
| IV | 67 | excellent | excellent |
| Comparative Example B | 57 | moderate | tacky surface; exudation symptoms |

EXAMPLES V AND VI

A 75% by weight solution of the reaction product of 1 molecule of the adduct of 3 molecules of hexamethylene diisocyanate and 1 molecule of water with 2 molecules of hydroxybutyl acrylate in a mixture of ethylglycol acetate, toluene and butyl acetate (1:1:5) was mixed with an equivalent amount (calculated on free NCO) of respectively an acrylate oxazolidine resin (available under the trade mark QR 568 of Rohm and Haas; Example V) and dioxazolidinylethyl adipate (Example VI). To the mixture there was added 2% by weight of benzophenone. In each experiment the composition thus obtained was applied to a degreased steel panel to a layer thickness of 30 μm (in the cured state) and subjected to radiation for 60 seconds with a medium-pressure mercury-vapour lamp (of the HTQ type made by Philips), which was positioned at a distance of 40 cm from the substrate. The cured layers were tack-free. The Persoz hardness was determined immediately after irradiation, and after 1 day, 3 days and 7 days, respectively. The results are given in Table 3. From these results it can be derived that the two oxazolidine compounds act as accelerators and from the increasing hardness of the coating it follows that the reaction of these compounds with the isocyanate compound is attended with an increase in the molecular weight of said isocyanate compound.

Table 3.

| Example | Immediately after irradiation | After 1 day | After 3 days | After 7 days |
|---------|-------------------------------|-------------|--------------|--------------|
| V       | 90                            | 240         | 270          | 310          |
| VI      | 51                            | 142         | 201          | 244          |

EXAMPLE VII

The procedure used in Example V was repeated, except that use was made of an equivalent amount of di-(tetrahydro-1,3-oxazinyl)propyladipate as accelerator. Immediately after radiation the Persoz hardness was 73 seconds and after 1 day, 3 days and 7 days, the values were 188 seconds, 229 seconds, and 247 seconds, respectively.

What is claimed is:

1. In a coating composition which is curable under the influence of ultraviolet light and is based on a U.V.-curable binder, a photoinitiator and a nitrogen-containing accelerator, the improved composition which comprises as an accelerator a tetrahydro-1,3-oxazine compound or an oxazolidine compound.

2. The coating composition of claim 1 wherein the tetrahydro-1,3-oxazine compound or the oxazolidine compound is polyfunctional.

3. The coating composition of claim 1 wherein the tetrahydro-1,3-oxazine compound or the oxazolidine compound is of low-molecular weight.

4. The coating composition of claim 1 wherein the oxazolidine compound is 2-isopropyl oxazolidine.

5. The coating composition of claim 1 wherein the tetrahydro-1,3-oxazine compound is di-(tetrahydro-1,3-oxazinyl)-propyl adipate.

6. The coating composition of claim 1 wherein the oxazolidine compound includes one or more oxazolidine groups which are attached to an oligomer chain or polymer chain by the nitrogen atom.

7. The coating composition of claim 6 wherein the oxazolidine compound is dioxazolidinyl ethyl adipate.

8. The coating composition of claim 6 wherein the oxazolidine compound is an acrylate oxazolidine resin.

9. The coating composition of claim 1 wherein the tetrahydro-1,3-oxazine compound or the oxazolidine compound is present in the composition in an amount of 0.1 to 100% by weight, based on the U.V.-curable binder.

10. The coating composition of claim 1 wherein the U.V.-curable binder is an adduct containing at least one isocyanate group of (a) an acrylic or methacrylic hydroxy ester having 5 to 20 carbon atoms and (b) a polyisocyanate having 4 to 40 carbon atoms and 2 to 4 isocyanate groups.

* * * * *